(12) United States Patent
Treese et al.

(10) Patent No.: US 9,281,658 B2
(45) Date of Patent: Mar. 8, 2016

(54) SYSTEM AND METHOD FOR CONTROLLING COLLOCATED MULTIPLE WAVELENGTH TUNED LASERS

(71) Applicant: Automotive Coalition for Traffic Safety, Inc., Washington, DC (US)

(72) Inventors: Derek Treese, Riverside, CA (US); Benjamin Ver Steeg, Redlands, CA (US); Len Cech, Brighton, MI (US)

(73) Assignee: Automotive Coalition for Traffic Safety, Inc., Washington, DC (US)

( * ) Notice: Subject to any disclaimer, the term of this patent is extended or adjusted under 35 U.S.C. 154(b) by 0 days.

(21) Appl. No.: 14/456,738

(22) Filed: Aug. 11, 2014

(65) Prior Publication Data
US 2015/0103852 A1    Apr. 16, 2015

Related U.S. Application Data

(60) Provisional application No. 61/889,320, filed on Oct. 10, 2013.

(51) Int. Cl.
| | |
|---|---|
| H01S 5/068 | (2006.01) |
| H01S 5/022 | (2006.01) |
| H01S 5/06 | (2006.01) |
| H01S 5/40 | (2006.01) |
| H01S 5/024 | (2006.01) |
| H01S 5/026 | (2006.01) |
| H01S 5/0683 | (2006.01) |

(52) U.S. Cl.
CPC ......... *H01S 5/06804* (2013.01); *H01S 5/02248* (2013.01); *H01S 5/0612* (2013.01); *H01S 5/4087* (2013.01); *H01S 5/0261* (2013.01); *H01S 5/02415* (2013.01); *H01S 5/06835* (2013.01); *H01S 5/06837* (2013.01)

(58) Field of Classification Search
CPC ... H01S 5/02453; H01S 5/06804; H01S 5/40; H01S 5/4025; H01S 5/02248; H01S 5/0612; H01S 5/4087; H01S 5/02415; H01S 5/0261; H01S 5/06835; H01S 5/06837
See application file for complete search history.

(56) References Cited

U.S. PATENT DOCUMENTS

| | | | |
|---|---|---|---|
| 5,515,391 A * | 5/1996 | Endriz | 372/34 |
| 2005/0169327 A1* | 8/2005 | Eden et al. | 372/29.02 |
| 2007/0092177 A1 | 4/2007 | Nilsson et al. | |

FOREIGN PATENT DOCUMENTS

| | | |
|---|---|---|
| EP | 2161800 | 3/2010 |
| WO | WO02/065598 | 8/2002 |

OTHER PUBLICATIONS

International Search Report and Written Opinion dated Nov. 13, 2014 for PCT/US2014/050575.

* cited by examiner

*Primary Examiner* — Armando Rodriguez
(74) *Attorney, Agent, or Firm* — Ropes & Gray LLP

(57) ABSTRACT

Systems and methods are disclosed herein for controlling laser beams for a plurality of collocated laser assemblies. The laser beams are optimized by controlling outputs of a primary power source (current for generating a laser beam) and a secondary power source (heating device) for each of the respective laser assemblies. The states of the power supply may be cycled and modulated to provide optimal performance.

14 Claims, 10 Drawing Sheets

| State | $\lambda_1$ | $\lambda_2$ | $\lambda_3$ | $\lambda_4$ |
|---|---|---|---|---|
| 1 | on | on | on | off |
| 2 | on | on | off | on |
| 3 | on | off | on | on |
| 4 | off | on | on | on |

FIG. 4

SYSTEM AND METHOD FOR CONTROLLING COLLOCATED MULTIPLE WAVELENGTH TUNED LASERS

CROSS REFERENCE TO RELATED APPLICATIONS

This application claims priority to U.S. Provisional Application Ser. No. 61/889,320 filed Oct. 10, 2013, entitled "Semiconductor Laser Thermal Control Method for Collocated Multiple Wavelength Tuned Lasers," the entire contents of which are hereby incorporated by reference.

INTRODUCTION

Semiconductor laser wavelength can vary due to changes in the device temperature. Semiconductor lasers such as distributed feedback (DFB) and/or ridge waveguide lasers often include electronic means to control the intensity and wavelength of the laser by applying a differential voltage to the positive and negative terminal and varying the laser current. By gradually increasing the applied current, the laser will operate with higher optical intensity and increasing wavelength. Only a portion of the applied energy is converted to optical energy while the remaining energy is converted to heat. Various control methods are employed to mitigate thermal variation to maintain desired nominal laser wavelength.

One method used to control wavelength in semiconductor lasers is to apply a secondary current to an electrode in proximity to the laser device (e.g., with a heater) to tune the wavelength to a desired target wavelength. Applying this secondary current will induce thermal transfer into the laser assembly (element) which changes the properties of the laser element including the physical dimension(s). The physical dimensions of the element can be controlled to increase and then stabilize the laser for operation at a target wavelength. The application of a constant target laser drive current and a heater current can be combined to achieve a stable target optical power and wavelength for a single laser element.

Multiple laser elements may be packaged together in a single package to normalize the devices across a target operational temperature; minimizing space/cost and allowing for consolidated control through pin-through electronic PCB mounted to a multi-element laser packages. In some applications, combinations of lasers mounted within a single package may be turned on and off rapidly. It may be desirable to achieve the same high stability (power level and wavelength) over long term operation for multiple proximally located, unique wavelength lasers which are modulated in patterns of varying on/off states as can be achieved with a single laser. However, when packaging multiple laser elements in spatial proximity to each other, and modulating these lasers in various patterns (states), induced heat from proximal laser elements can induce undesirable spatial/temporal temperature variations that effect the stabilization of the active lasers in that state. Accordingly thermal effects of the proximal lasers can affect the achieved optical power and wavelength causing deviation from the target optical power and wavelength and/or a delay in reaching stable operation at a given state. Unless these effects are known and compensated for, they can limit the achievable accuracy and precision of measurements, or the achievable rate of change (modulation rate) of the laser states, limiting the practical utility of the multi-element design.

SUMMARY

One embodiment of the invention relates to a method for applying a controlled primary current and a secondary current to a laser device having multiple laser assemblies. The primary current and the secondary current are controlled to reduce the thermal proximal dissipation and the resulting effects on optical power and wavelength variance, and to achieve a minimal settling time between laser modulation states. This is useful for optimizing an arrangement of multiple assemblies in close proximity.

In an embodiment, a method for controlling a plurality of collocated lasers is provided by detecting at a controller, an arrangement of a plurality of proximal lasers, determining a thermal effect caused by a first of the plurality of lasers on a second of the plurality of proximal lasers, and controlling an output of a primary power source and an output of a secondary power source to power the first of the plurality of proximal lasers and the second of the plurality of proximal lasers, based on the thermal effect. The output of the primary power source and the output of the secondary power source may include cycling the primary power source and the secondary power source in an off state and an on state; wherein when the primary power source is in an on state, the secondary power source is in an off state. Thermal effect caused by the first of the plurality of proximal lasers on the second of the plurality of proximal lasers differs from a second thermal effect caused by the second of the plurality of proximal lasers on a third of the plurality of proximal lasers; and further comprising controlling the output of the primary power source and an output of a secondary power source to power the third of the plurality of proximal lasers. The primary power source may provide current for generating a laser beam, and the secondary power source may provide a current for heating the respective laser. The output of the primary power source and the secondary power source may be varied based on a detected thermal transient. A modulating pattern of off states and on states of the output of the primary power source and the secondary power source may be used. The power for the proximal lasers may be controlled to optimize a specified wavelength and optical power for obtaining a spectrometry measurement.

BRIEF DESCRIPTION OF THE DRAWINGS

Features, aspects, and advantages of the present invention will become apparent from the following description, and the accompanying exemplary embodiments shown in the drawings, which are briefly described below.

FIG. 4 is a table of modulation states for the laser assembly array of FIG. 2, according to an exemplary embodiment.

DETAILED DESCRIPTION

To provide an overall understanding of the disclosure, certain illustrative embodiments will now be described, including a system and method for controlling collocated multiple wavelength tuned lasers. In particular, a system and method are described that allows for controlling wavelength and laser output of a plurality of lasers that are proximally located. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof. Generally, the systems and methods described herein may relate to controlling light and optical beams, using one or more wavelengths, for use in measurements, in particular biochemical measurements, or other measurements using discrete wavelength spectrometry. Although the embodiments described herein relate to multiple proximal lasers, the principles may be applied to a single laser, for example, a single laser that is operating in a modulated fashion having on/off switching.

Figure 1:
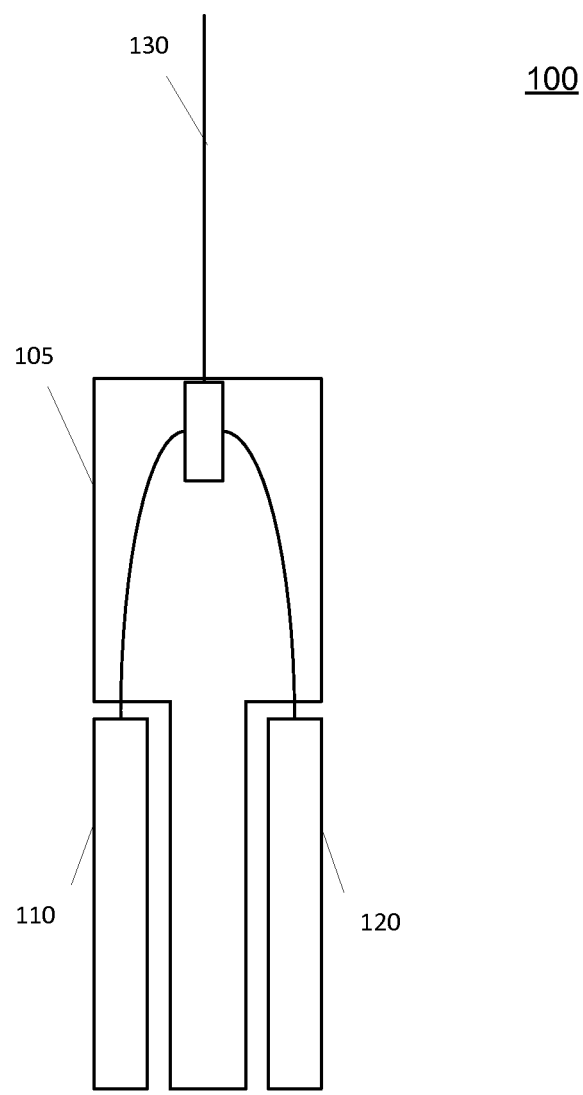
FIG. 1 is a schematic diagram of a laser assembly, according to an exemplary embodiment.

Referring to FIG. 1, a semiconductor laser assembly 100 is shown schematically according to an exemplary embodiment to include a laser device 105. The semiconductor laser device may be, for example, a distributed feedback (DFB) or a ridge waveguide laser. The laser assembly includes an input for a primary power source 110. The primary power source provides a current to the laser device 105 to generate a laser beam 130. A portion of the applied energy is converted to optical energy and the remaining energy is converted to waste heat. This waste heat may have an effect on various properties of the laser device (e.g., physical dimensions), thereby varying the properties of the laser beam output (e.g., the wavelength, power output, etc.). The laser assembly may further include an input for a secondary power source 120. The secondary power source 120 (e.g., heater) provides a current to the laser device to cause heating of the body of the laser device. In general, the secondary power source 120 provides thermal power, not optical.

The current supplied to the laser device 105 by the primary power source 110 may be cycled on and off. Concurrently, the current supplied by the secondary power source 120 may also be cycled on and off. In some embodiments, the currents are supplied by the primary power source 110 and secondary power source 120 may be input on different cycles so that when the heater (secondary power source 120) inputs current in an "on" state, the primary power source 110 may be in an "off" state, and vice versa. In general, the cycles are adjusted to maintain normalized and balanced power to the laser device 105 to maintain an optimized beam 130. When taking measurements using such laser devices, the optical beam should perform at an optimized power level and wavelength. Controlling the power and heater inputs can help achieve the optimal performance.

The currents provided to the laser device 105 from the primary power source 110 and the secondary power source 120 may be varied depending on the state of the laser. To accomplish a nominal applied energy, when a laser assembly is in an "off" mode, the primary current is held below a threshold (e.g., a lasing threshold) while the heater current is held higher so that the combination of total applied energy (primary plus secondary) is equal to a predetermined constant. When a laser assembly is switched to the "on" state, the primary current is increased and the secondary current is reduced to maintain an approximately constant energy density. The thermal energy density is maintained in order to minimize thermal transients in the laser assembly as it is switched between the on state and the off state.

Figure 2:
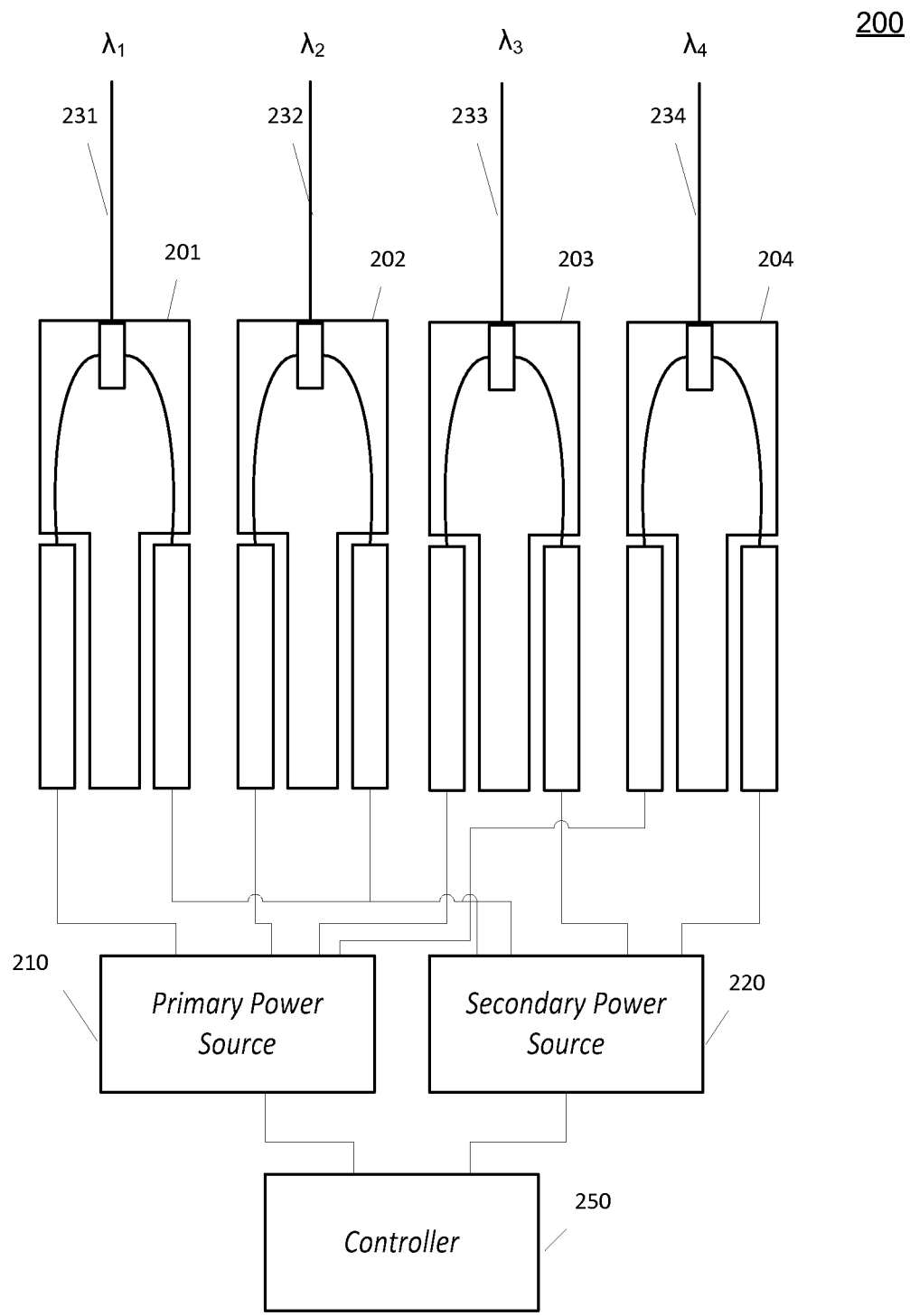
FIG. 2 is schematic view of an array of multiple laser assemblies, according to an exemplary embodiment.
Figure 3A:
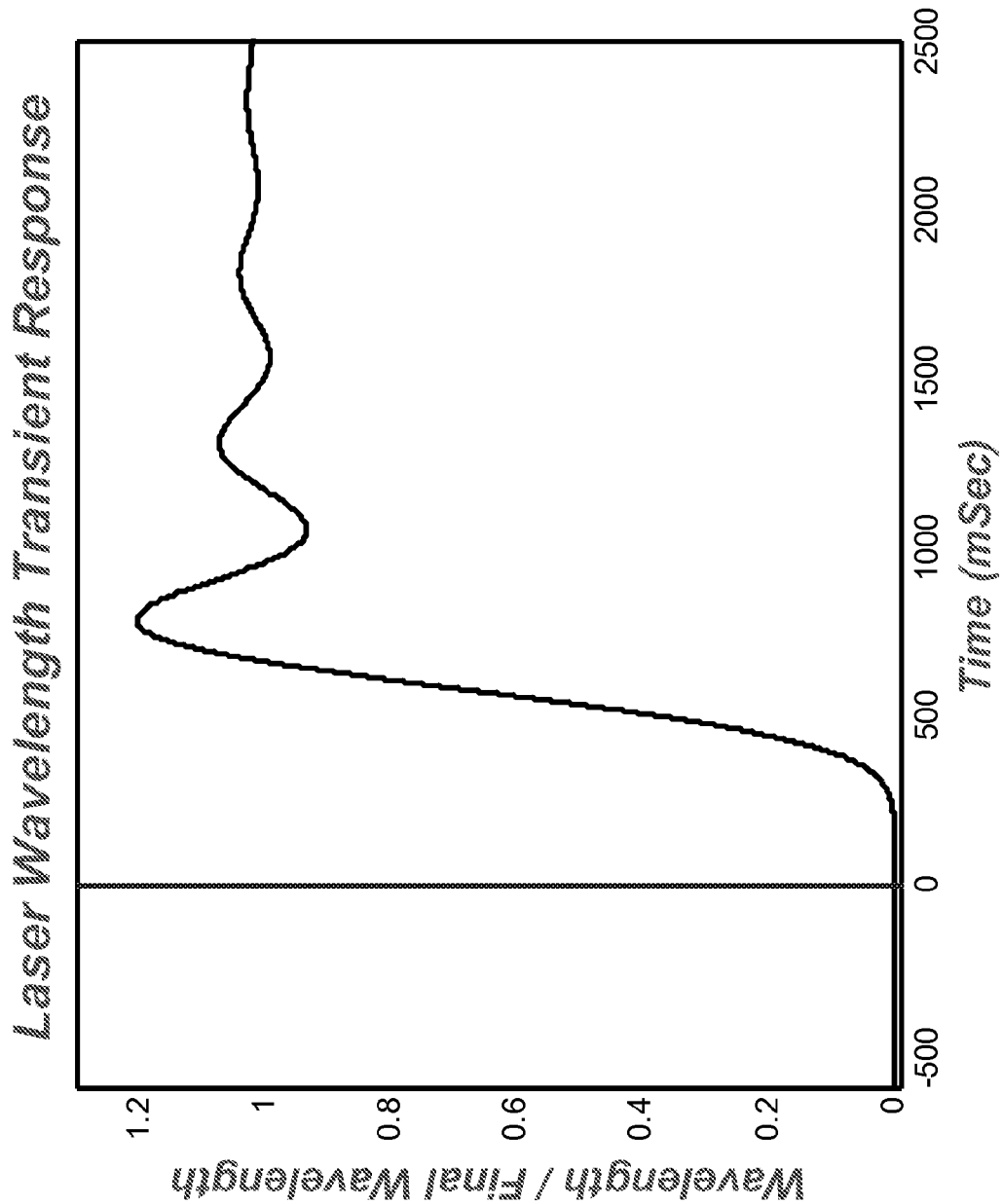
FIGS. 3A-F are graphs showing state transitions for the laser assembly array of FIG. 2, according to an exemplary embodiment.
Figure 3B:
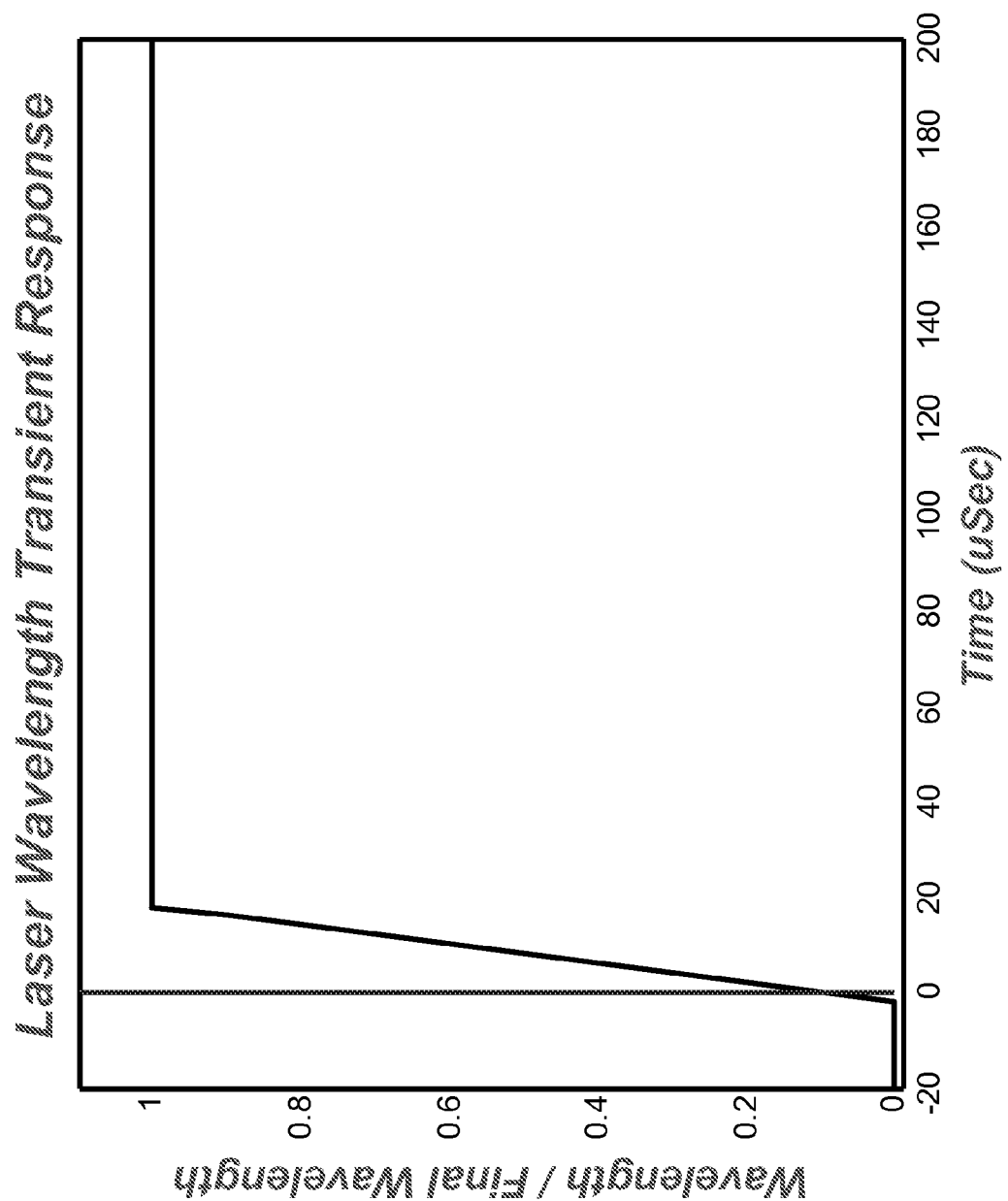
Figure 3C:
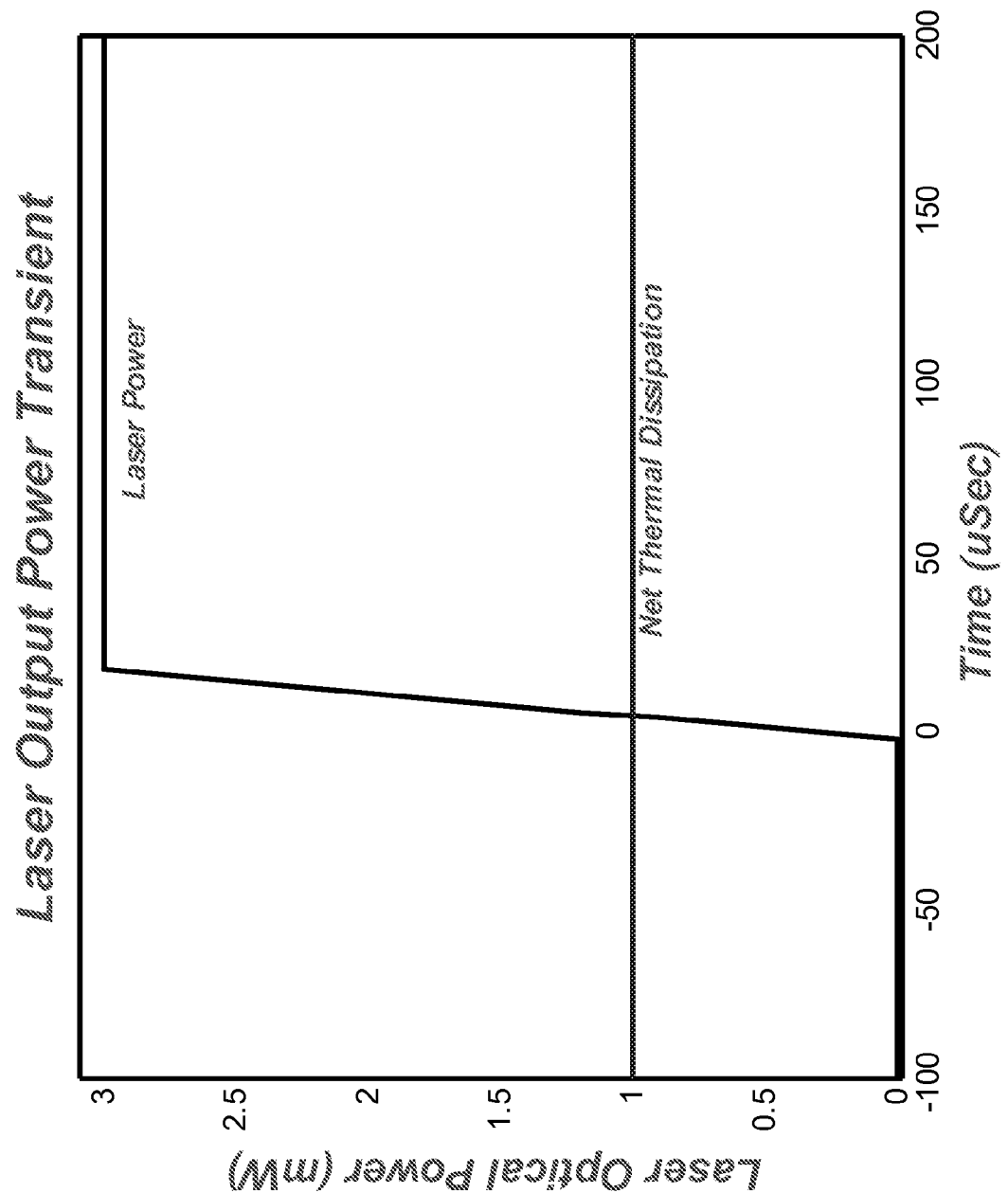
Figure 3D:
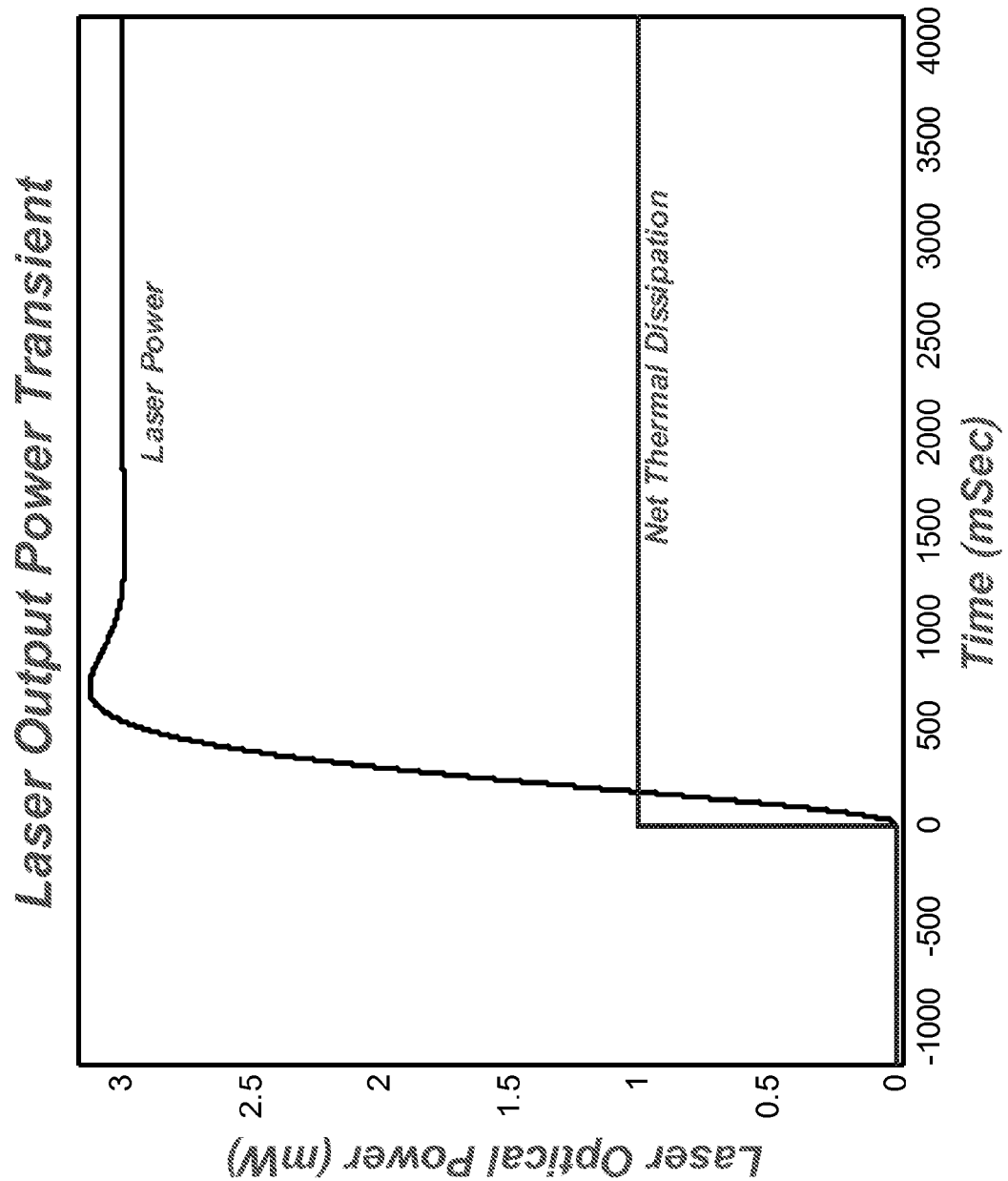
Figure 3E:
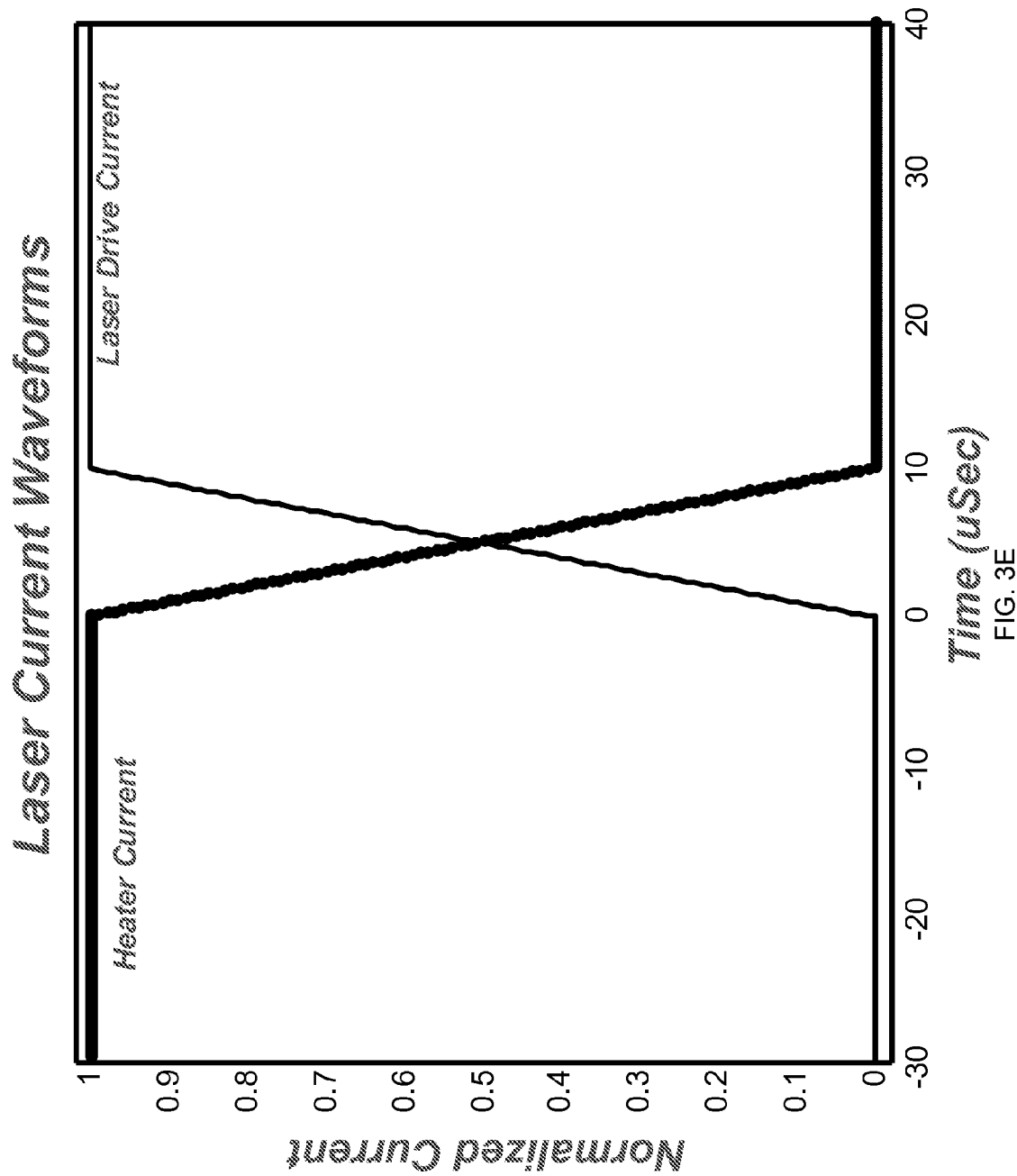
Figure 3F:
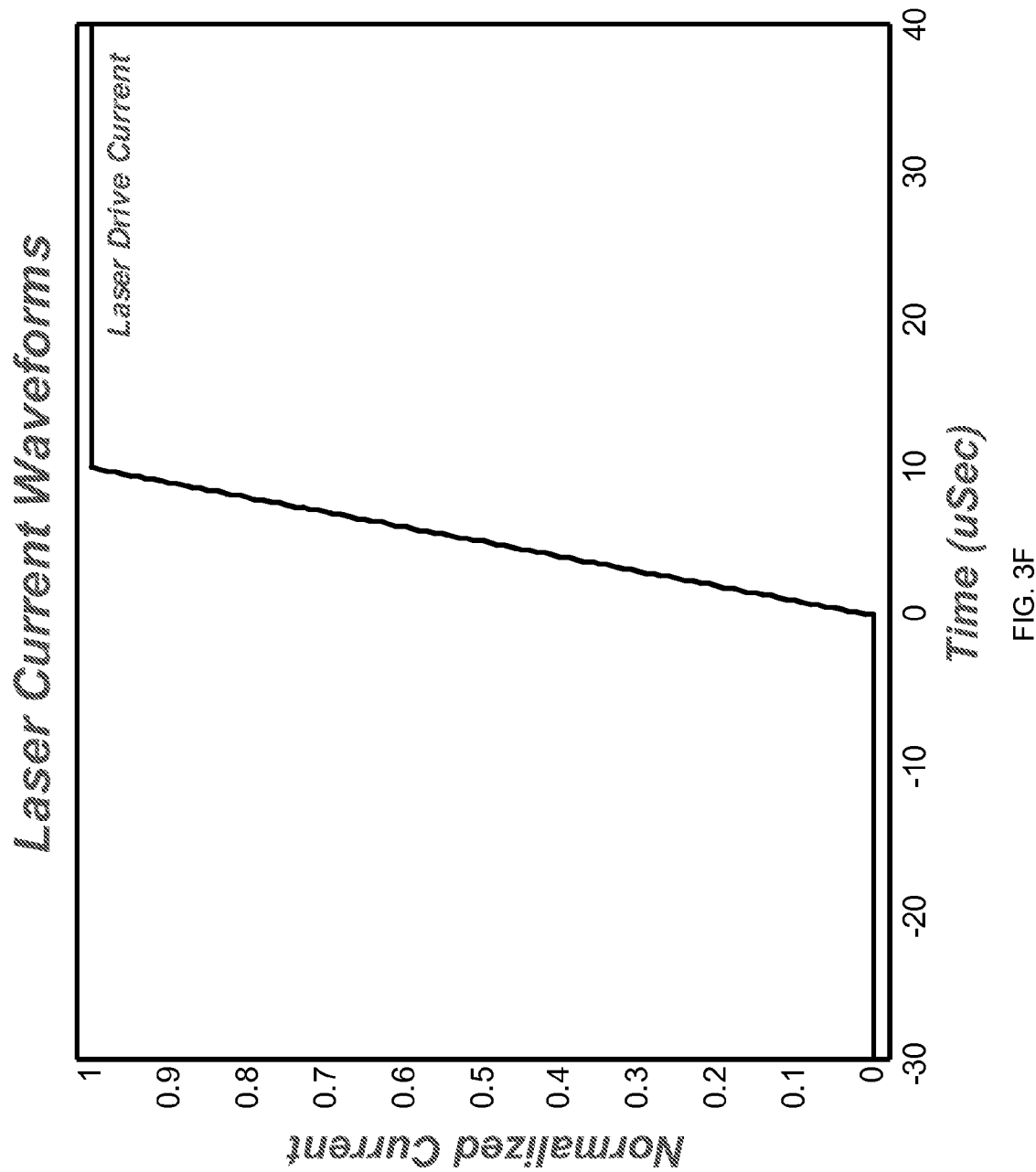
Figure 5:
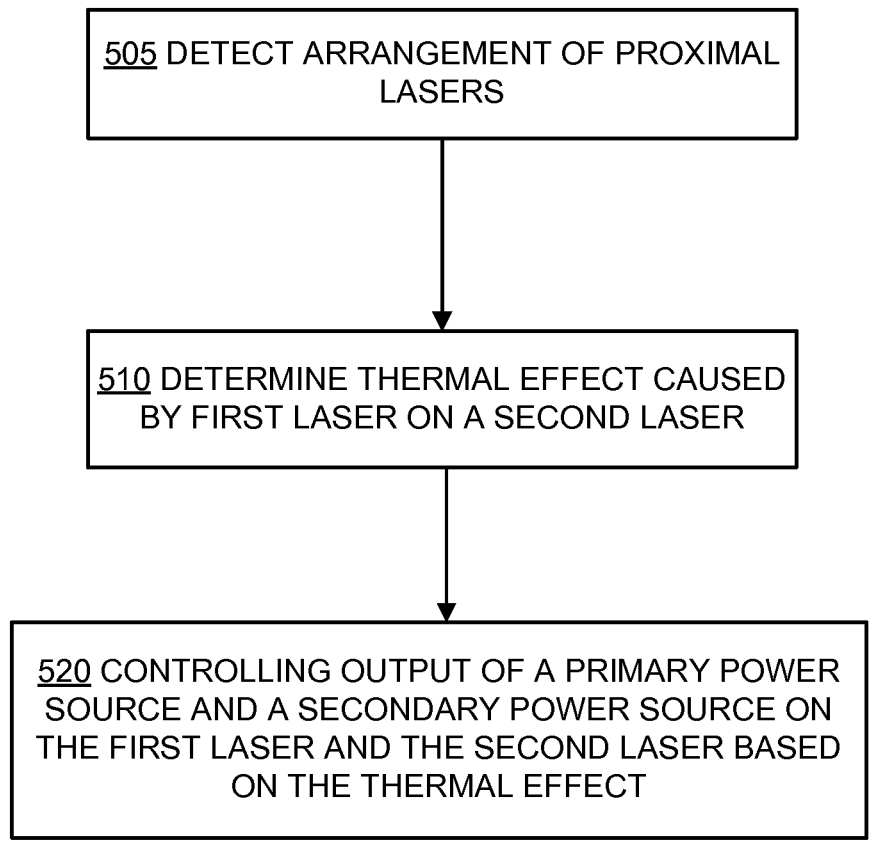
FIG. 5 is a method for controlling multiple laser assemblies, according to an exemplary embodiment.

Referring now to FIG. 2, a plurality of laser assemblies are shown as 200. The laser assemblies 201, 202, 203, 204 may be coupled together in an array or package to minimize space/cost and allows for consolidated electronic control through pin-through PCB mounts. The laser assemblies 201, 202, 203, 204 may each operate to produce lasers 231, 232, 233, 234 of unique wavelengths (e.g., $\lambda_1$, $\lambda_2$, $\lambda_3$, $\lambda_4$). The individual lasers 231, 232, 233, 234 may be modulated rapidly in patterns by varying on/off states of the individual laser assemblies 201, 202, 203, 204. The lasers assemblies 201, 202, 203, 204 may be controlled with a controller 250 that varies the currents provided by the primary power source 210 and the secondary power source 220 to normalize thermal proximal dissipation between the collocated laser assemblies 201, 202, 203, 204 and the resulting effects on optical power and wavelength variance, and to achieve a minimized settling time between laser modulation states, as shown in FIGS. 3A-F. In general, a settling time may be 10 μsec. Other settling times may also be achieved, for example, in the range 5-10 μsec. The transition settling time is optimized to provide a net zero thermal transient when cycling from an off state to an on state so that there is no thermal interplay with the surrounding laser assemblies or a laser temperature control loop. As shown in FIGS. 3A-F, various wavelength transient responses, output power transients, and laser current waveforms may be achieved.

The controller 250 is configured to apply a constant total current (sum of primary current and secondary current) to maintain a nominal applied energy profile (e.g. thermal) profile across all proximal laser assemblies 201, 202, 203, 204 in the package while supporting the laser modulation of all state combinations, as shown in FIG. 4. As shown FIG. 4 shows states of lasers 231, 232, 233, 234 having cycling on and off states.

Based on the configuration and placement of the laser assemblies 201, 202, 203, 204, various primary current and secondary currents may be used to achieve optimal laser performance. For example, outer laser assemblies 201 and 204 may have different current combinations than inner laser assemblies 202 and 203 because the inner assemblies 202 and 203 may have an increased thermal condition due to having two neighboring assemblies. The outer laser assemblies 201 and 204 having only one laser assembly alongside (e.g., 202 and 203, respectively), have a different thermal condition.

For a configuration of only one laser assembly, thermal characteristics of the laser assembly and package will affect a selection of appropriate primary and secondary currents.

By varying the primary current and the secondary current as the laser assemblies 201, 202, 203, 204 are switched between the on and off states, the thermal transients in the multi-laser package can be reduced through more continuous energy loading.

Controlling the primary and secondary currents can also reduce the settling time between states and provide potential for measuring additional states (improved signal to noise ratio) in a fixed measurement time.

Controlling the primary and secondary currents can also decrease the measurement times in discrete wavelength spectrometer applications in various fields (e.g., industrial, commercial, medical, consumer, etc.).

Controlling the primary and secondary currents further normalize thermal dissipation, potentially improving the power stability and wavelength stability of the emitted laser beam.

In a modulation mode, controlling the primary current and the secondary current improves the stabilization time for individual laser assemblies and reduces thermal variation across proximal lasers in an array.

In one exemplary embodiment, the array includes a plurality of proximally mounted ridge wave guide lasers being modulated through all permutations of states. By controlling the primary currents and the secondary currents supplied to the laser assemblies as described above, the array may be stabilized between modulation states within 10 micro seconds.

It is important to note that the construction and arrangement of the laser assembly and control system as shown in the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A method for controlling a plurality of collocated lasers, the method comprising:
    detecting at a controller, an arrangement of a plurality of proximal lasers;
    determining a thermal effect caused by a first of the plurality of lasers on a second of the plurality of proximal lasers; and
    controlling an output of a primary power source and an output of a secondary power source to power the first of the plurality of proximal lasers and the second of the plurality of proximal lasers, based on the thermal effect.

2. The method of claim 1 wherein controlling the output of the primary power source and the output of the secondary power source comprises cycling the primary power source and the secondary power source in an off state and an on state; wherein when the primary power source is in an on state, the secondary power source is in an off state.

3. The method of claim 1 wherein the thermal effect caused by the first of the plurality of proximal lasers on the second of the plurality of proximal lasers differs from a second thermal effect caused by the second of the plurality of proximal lasers on a third of the plurality of proximal lasers; and further comprising controlling the output of the primary power source and an output of a secondary power source to power the third of the plurality of proximal lasers.

4. The method of claim 1 wherein the primary power source comprises a current for generating a laser beam, and the secondary power source comprises a current for heating the respective laser.

5. The method of claim 1 further comprising varying the output of the primary power source and the secondary power source based on a detected thermal transient.

6. The method of claim 1 further comprising modulating a pattern of off states and on states of the output of the primary power source and the secondary power source.

7. The method of claim 1 further comprising controlling the plurality of proximal lasers based on a specified wavelength and optical power for obtaining a spectrometry measurement.

8. A system for controlling a plurality of collocated lasers, the system comprising:
    a plurality of proximally located laser assemblies, each respective laser assembly powered by a primary power source and a secondary power source; and
    a controller configured to:
        detecting an arrangement of the plurality of proximal lasers;
        determine a thermal effect caused by a first of the plurality of lasers on a second of the plurality of proximal lasers; and
        control the output of the primary power source and the secondary power source to power the first of the plurality of proximal lasers and the second of the plurality of proximal lasers, based on the thermal effect.

9. The system of claim 8 wherein controlling the output of the primary power source and the output of the secondary power source comprises cycling the primary power source and the secondary power source in an off state and an on state; wherein when the primary power source is in an on state, the secondary power source is in an off state.

10. The system of claim 8 wherein the thermal effect caused by the first of the plurality of proximal lasers on the second of the plurality of proximal lasers differs from a second thermal effect caused by the second of the plurality of proximal lasers on a third of the plurality of proximal lasers; and further comprising controlling the output of the primary power source and an output of a secondary power source to power the third of the plurality of proximal lasers.

11. The system of claim 8 wherein the primary power source comprises a current for generating a laser beam, and the secondary power source comprises a current for heating the respective laser.

12. The system of claim 8 further comprising varying the output of the primary power source and the secondary power source based on a detected thermal transient.

13. The system of claim 8 further comprising modulating a pattern of off states and on states of the output of the primary power source and the secondary power source.

14. The system of claim 8 further comprising controlling the plurality of proximal lasers based on a specified wavelength and optical power for obtaining a spectrometry measurement.

* * * * *